(12) United States Patent
Koide

(10) Patent No.: US 8,289,728 B2
(45) Date of Patent: Oct. 16, 2012

(54) INTERCONNECT BOARD, PRINTED CIRCUIT BOARD UNIT, AND METHOD

(75) Inventor: Masateru Koide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 217 days.

(21) Appl. No.: 12/888,013

(22) Filed: Sep. 22, 2010

(65) Prior Publication Data

US 2011/0080718 A1    Apr. 7, 2011

(30) Foreign Application Priority Data

Oct. 2, 2009    (JP) ................................. 2009-230913

(51) Int. Cl.
*H05K 1/11*    (2006.01)
*H05K 1/14*    (2006.01)
(52) U.S. Cl. ......... 361/803; 361/790; 361/792; 361/795
(58) Field of Classification Search .................. 361/790, 361/792–795, 803; 257/685–686
See application file for complete search history.

(56) References Cited

U.S. PATENT DOCUMENTS

| | | | | |
|---|---|---|---|---|
| 4,793,814 | A * | 12/1988 | Zifcak et al. ..................... | 439/66 |
| 5,477,933 | A | 12/1995 | Nguyen | |
| 5,953,214 | A * | 9/1999 | Dranchak et al. .............. | 361/767 |
| 6,239,485 | B1 * | 5/2001 | Peters et al. .................. | 257/700 |
| 6,806,563 | B2 | 10/2004 | Libous et al. | |
| 6,975,518 | B2 * | 12/2005 | Frutschy et al. ............... | 361/769 |
| 7,049,208 | B2 | 5/2006 | Muthukumar et al. | |
| 7,180,752 | B2 * | 2/2007 | Chamberlin et al. ......... | 361/790 |
| 7,518,881 | B2 * | 4/2009 | Cornelius ..................... | 361/760 |
| 2002/0063331 | A1 | 5/2002 | Honda | |

FOREIGN PATENT DOCUMENTS

| | | |
|---|---|---|
| EP | 0601375 A | 6/1994 |
| JP | 01-152689 | 6/1989 |
| JP | 2000-323610 A | 11/2000 |
| JP | 2004-31738 A | 1/2004 |
| JP | 2004-289133 A | 10/2004 |

OTHER PUBLICATIONS

"Extended European Search Report", mailed by EPO and corresponding to European application No. 10181898.7 on Feb. 2, 2011.
"Official Communication from EPO", mailed by EPO and corresponding to European application No. 10179078.0 on Feb. 4, 2011.

* cited by examiner

*Primary Examiner* — Tuan T Dinh
(74) *Attorney, Agent, or Firm* — Fujitsu Patent Center

(57) ABSTRACT

An interconnect board for interconnecting and arranged between a first circuit board and a second circuit board, the interconnect board includes a first conductive plate including a first connection terminal, a first insulating member wrapping the first conductive plate except for the first connection terminal, a second conductive plate including a second connection terminal, a second insulating member wrapping the second conductive plate except for the second connection terminal, an insulating substrate arranged between the first insulating member and the second insulating member, and a conductive member penetrating the first insulating member, the second insulating member and the insulating substrate.

8 Claims, 11 Drawing Sheets

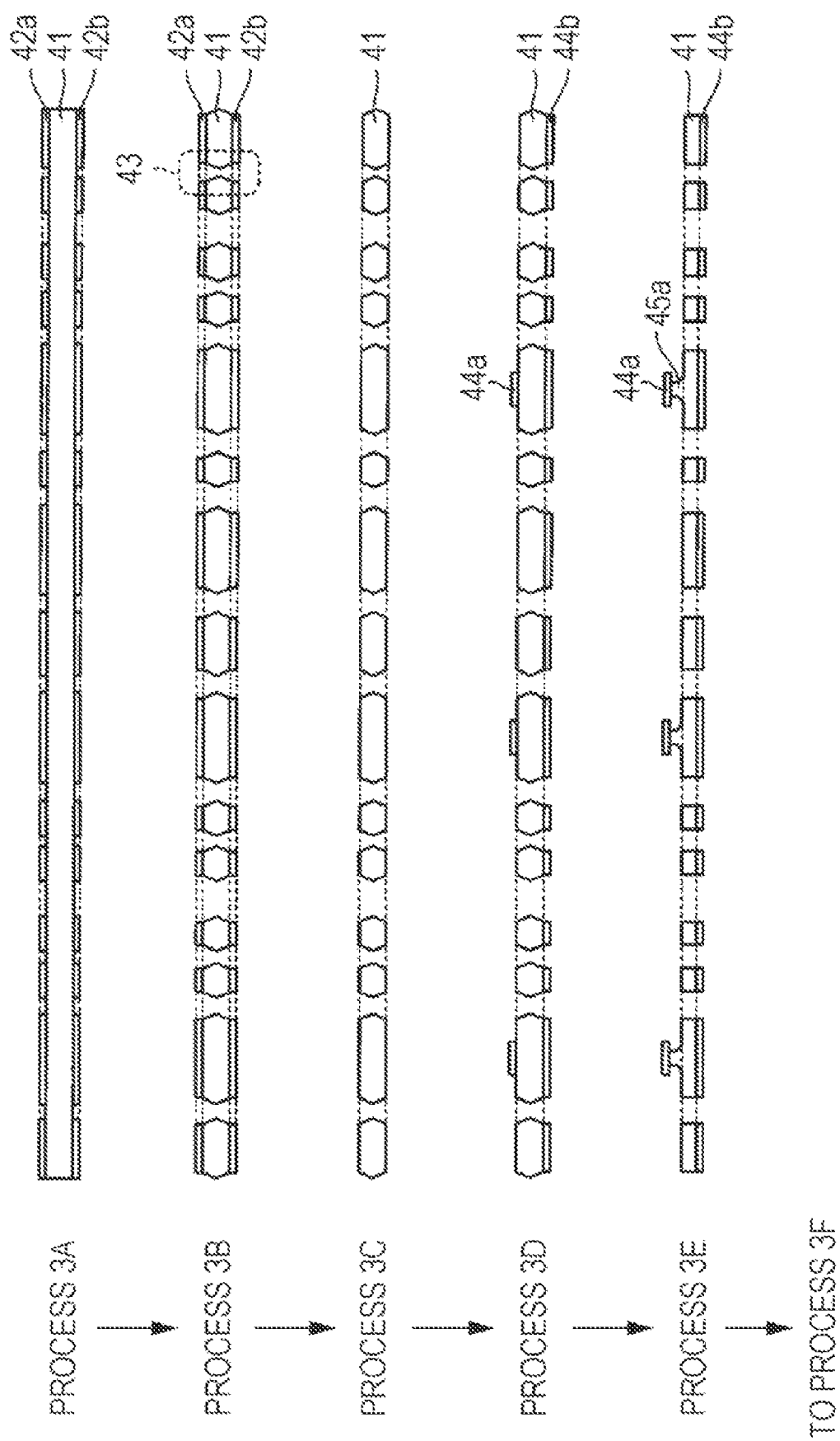

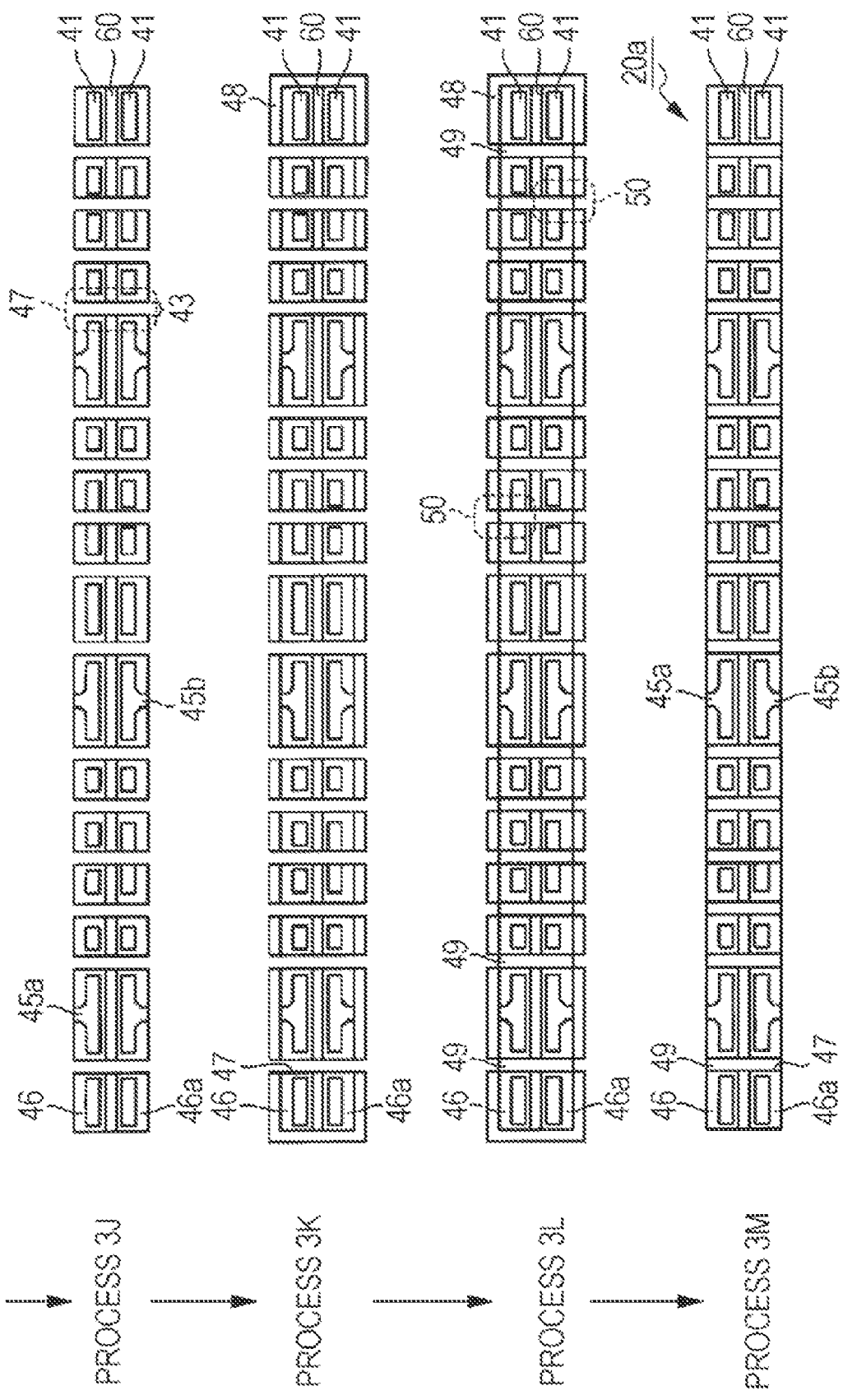

INTERCONNECT BOARD, PRINTED CIRCUIT BOARD UNIT, AND METHOD

CROSS-REFERENCE TO RELATED APPLICATION

This application is based upon and claims the benefit of priority of the prior Japanese Patent Application No. 2009-230913, filed on Oct. 2, 2009, the entire contents of which are incorporated herein by reference.

FIELD

The embodiments discussed herein are related to an interconnect board, a printed circuit board unit, and a method for fabricating interconnect board.

BACKGROUND

Semiconductor elements in semiconductor-element packages are getting thinner and larger in recent years. When the semiconductor elements are fixed on resin package substrates, a difference between a thermal expansion coefficient of the semiconductor elements and that of the package substrates causes inconvenience: the semiconductor elements hardly deflect because of heat, whereas the package substrates deflect or bend because of heat. This inconvenience may cause disconnection in electrical joint portions of the semiconductor elements and the package substrates.

Stainless or copper stiffening members (hereinafter, referred to as stiffeners) are attached on the package substrates to reduce the thermal deflection or bending of the package substrates. In this way, disconnection is avoided in the electrical joint portions of the semiconductor elements and the package substrates.

However, the foregoing related art has following disadvantages. More specifically, in the semiconductor-element packages, capacitors are generally arranged on a surface of the package substrates opposite to a surface mounting the semiconductor elements to face the semiconductor elements for better electric performance. To avoid interference between the capacitors and circuit boards for mounting the semiconductor-element packages, low-profile capacitors are used. Additionally, a hole is bored or countersunk at a portion of the circuit boards that interferes with the capacitors.

Since the low-profile capacitors are expensive, the use of the low-profile capacitors unfortunately increases a fabrication cost of the semiconductor-element packages. Additionally, boring or countersinking a hole in the circuit boards unfortunately decreases electric performance of the semiconductor-element packages and the circuit boards.

The decrease in the electric performance indicates the following. For example, when a wire for supplying electric power to the semiconductor-element packages is arranged to detour around the bored or countersunk portion, the wire becomes longer than other wires for supplying electric power. Since voltage drops in proportion to length of a wire, it becomes difficult to maintain potentials of the wires having different lengths at a uniform level.

The followings are reference documents.
[Patent Document 1] Japanese Laid-open Patent Publication No. 2000-323610
[Patent Document 2] Japanese Laid-open Patent Publication No. 2004-289133

SUMMARY

According to an aspect of the embodiment, an interconnect board for interconnecting and arranged between a first circuit board and a second circuit board, the interconnect board includes a first conductive plate including a first connection terminal to be electrically connected to a power supply terminal or a ground terminal of each of the first circuit board and the second circuit board, a first insulating member wrapping the first conductive plate except for the first connection terminal, a second conductive plate including a second connection terminal to be electrically connected to the power supply terminal or the ground terminal of each of the first circuit board and the second circuit board, a second insulating member wrapping the second conductive plate except for the second connection terminal, an insulating substrate arranged between the first insulating member and the second insulating member, and a conductive member penetrating the first insulating member, the second insulating member and the insulating substrate to electrically connect a signal terminal of the first circuit board to a signal terminal of the second circuit board.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A-3C are diagrams illustrating processes for fabricating the interposer according to the second embodiment;

DESCRIPTION OF EMBODIMENTS

Preferred embodiments of the present techniques will be explained with reference to accompanying drawings.

An interconnect board, a printed circuit board unit, and a method for fabricating an interconnect board according to embodiments of the disclosed technology will be described in detail below based on the accompanying drawings. The interconnect board indicates an electronic component for mounting, on a circuit board, a semiconductor-element package including a semiconductor element mounted on a package substrate. The disclosed technology is not limited by the embodiments described below.

Figure 1:
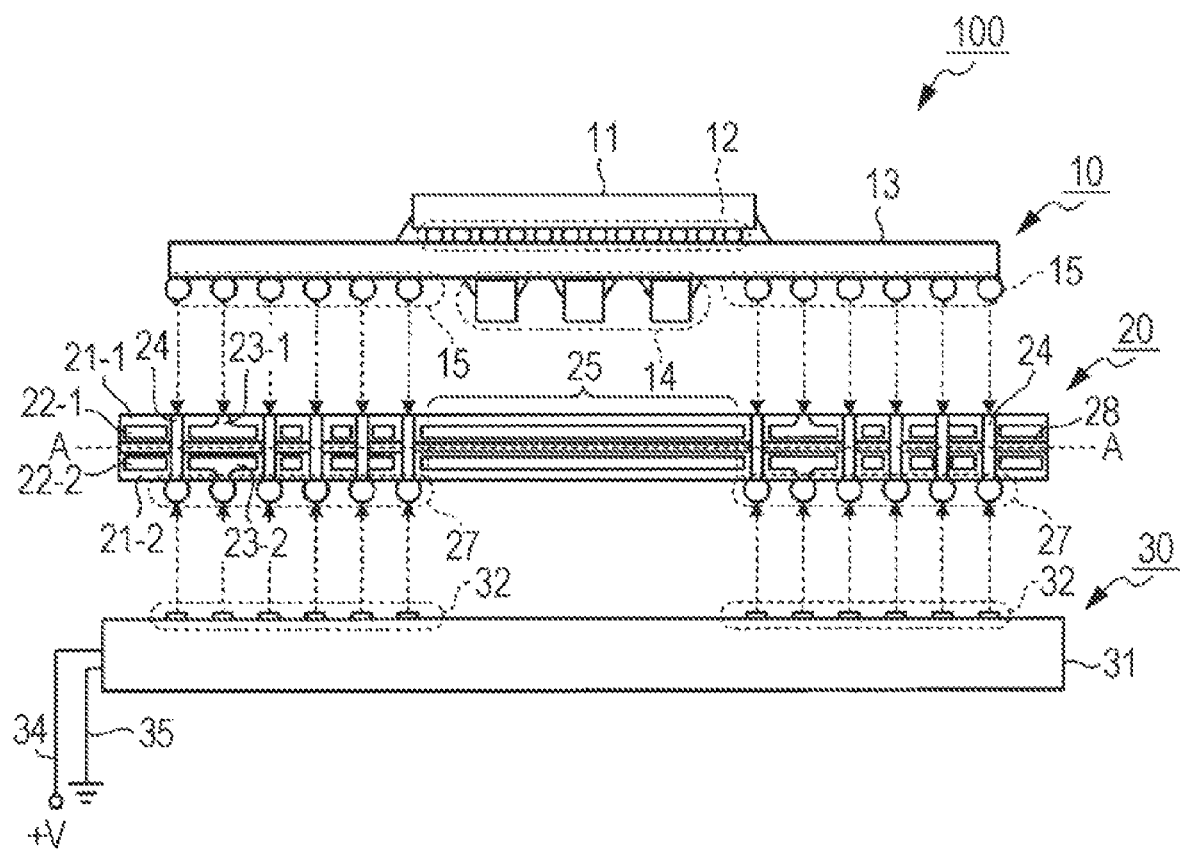
FIG. 1 is a diagram of a cross section of a board unit according to a first embodiment viewed from a lateral side thereof.

FIG. 1 is a diagram of a cross section of a board unit according to a first embodiment viewed from a lateral side thereof. More specifically, FIG. 1 is a diagram of a first circuit board 10, an interconnect board 20, and a second circuit board 30 included in a board unit 100 according to the first embodiment, each viewed from a lateral side thereof. FIG. 1 illustrates a sectional view of the interconnect board 20. As illustrated in FIG. 1, predetermined portions of the first circuit board 10, the interconnect board 20, and the second circuit board 30 are joined together in accordance with dotted-line arrows of FIG. 1, whereby the first circuit board 10 is mounted on the second circuit board 30 with the interconnect board 20.

In the first circuit board 10, a semiconductor element 11 is mounted on one surface of a package substrate 13 to be electrically connected to the package substrate 13 through connection terminals 12. For example, solder balls, lead wires, or electrode pads function as the connection terminals 12.

Electronic components 14, such as capacitors, and connection terminals 15 are arranged on the other surface of the package substrate 13 without the semiconductor element 11. The electronic components 14 are arranged to face the semiconductor element 11 across the package substrate 13.

The electronic components 14 are electrically connected to the semiconductor element 11 through predetermined electric wiring, not illustrated, in layers of the package substrate 13. The semiconductor element 11 is also connected to the connection terminals 15 through predetermined electric wiring, not illustrated, in the layers of the package substrate 13. The connection terminals 15 are arranged to surround the electronic components 14 on the other surface of the package substrate 13 without the semiconductor element 11.

The interconnect board 20 includes a first insulating layer 21-1 and a first metal plate 22-1 wrapped in the first insulating layer 21-1. The interconnect board 20 also includes a second insulating layer 21-2 and a second metal plate 22-2 wrapped in the second insulating layer 21-2. The interconnect board 20 further includes an insulating substrate 28 between the first insulating layer 21-1 and the second insulating layer 21-2. The insulating substrate 28 extends over a plane indicated by line A-A between the first insulating layer 21-1 and the second insulating layer 21-2. The insulating substrate 28 is made of, for example, an insulating resin, such as polyimide.

The interconnect board 20 is, for example, rectangular or square and has a predetermined thickness. The first and second insulating layers 21-1 and 21-2 are plate-like and made of, for example, a glass fiber reinforced epoxy resin having a flame resistance of FR-4 or a non-conductive resin having strength equal to or higher than the glass fiber reinforced epoxy resin. The first and second metal plates 22-1 and 22-2 are made of, for example, a copper foil or a metal having conductivity equal to or higher than copper. Thanks to the first and second insulating layers 21-1 and 21-2 and the first and second metal plates 22-1 and 22-2, respectively, the interconnect board 20 has strength enough to suppress bending and deflection of the first circuit board 10.

The interconnect board 20 includes first connection terminals 23-1 incorporated in the first metal plate 22-1. The first connection terminals 23-1 penetrate the first insulating layer 21-1 from a predetermined position of the first metal plate 22-1 to be exposed on a surface for mounting the first circuit board 10. The interconnect board 20 also includes second connection terminals 23-2 incorporated in the second metal plate 22-2. The second connection terminals 23-2 penetrate the second insulating layer 21-2 from a predetermined position of the second metal plate 22-2 to be exposed on a surface facing the second circuit board 30. Furthermore, the interconnect board 20 includes metal piles 24 penetrating the first insulating layer 21-1, the first metal plate 22-1, the insulating substrate 28, the second metal plate 22-2, and the second insulating layer 21-2 from the surface for mounting the first circuit board 10 to the surface facing the second circuit board 30. The metal piles 24 are an example of the conductive member.

The first connection terminals 23-1 are electrically connected to a power supply terminal and a ground terminal of the first circuit board 10 through the connection terminals 15. Similarly, the second connection terminals 23-2 are electrically connected to a power supply terminal and a ground terminal of the second circuit board 30 through connection terminals 27. The first metal plate 22-1 opposes to the second metal plate 22-2 with respect to the insulating substrate 28 extending over the plane indicated by line A-A illustrated in FIG. 1. The insulating substrate 28 arranged between the first insulating layer 21-1 wrapping the first metal plate 22-1 and the second insulating layer 21-2 wrapping the second metal plate 22-2 generates a capacitor effect, such as improvement of electrical properties. The capacitor effect allows the first metal plate 22-1 and the second metal plate 22-2 to electrically function as one structure.

Accordingly, the first and second metal plates 22-1 and 22-2 function as one power supply layer or one ground layer in the interconnect board 20. The metal piles 24 electrically connect signal terminals of the first circuit board 10 to corresponding signal terminals of the second circuit board 30. Some of the metal piles 24 arranged in predetermined portions are in contact with the first metal plate 22-1 and the second insulating layer 21-2 or with the second metal plate 22-2 and the first insulating layer 21-1.

As illustrated in FIG. 1, the interconnect board 20 may have more than one first connection terminal 23-1 and more than one second connection terminal 23-2. In such a case, when one of the first connection terminals 23-1 and one of the second connection terminals 23-2 are connected to the power supply terminals of the first circuit board 10 and the second circuit board 30, respectively, the two metal plates (the first and second metal plates 22-1 and 22-2) function as one power supply layer. Similarly, when one of the first connection terminals 23-1 and one of the second connection terminals 23-2 are connected to the ground terminals of the first circuit board 10 and the second circuit board 30, respectively, the two metal plates 22-1 and 22-2 function as one ground layer. The number of the metal piles 24 is equal to the number of the signal terminals of the first circuit board 10 and the number of the corresponding signal terminals of the second circuit board 30. In FIG. 1, the reference characters are representatively attached to one of the first connection terminals 23-1, one of the second connection terminals 23-2, and one of the metal piles 24, and the reference characters for the other first connection terminals 23-1, the other second connection terminals 23-2, and the other metal piles 24 are omitted.

The first connection terminals 23-1 and the second connection terminals 23-2 are arranged in accordance with positions of the power supply terminals and the ground terminals of the first circuit board 10 and the second circuit board 30, respectively. The metal piles 24 are arranged in accordance with positions of the signal terminals of the first circuit board 10 and the corresponding signal terminals of the second circuit board 30.

The interconnect board 20 has a through hole 25 penetrating the first insulating layer 21-1, the first metal plate 22-1, the insulating substrate 28, the second metal plate 22-2, and the second insulating layer 21-2 at a range where the first insulating layer 21-1 faces the electronic components 14 of the first circuit board 10. The range where the first insulating layer 21-1 faces the electronic components 14 is in, for example, a rectangular or square shape. The through hole 25 may prevent physical interference between the electronic components 14 and the interconnect board 20 from occurring when the interconnect board 20 is arranged between the first circuit board 10 and the second circuit board 30.

The second circuit board 30 may include connection terminals 32 on a surface of a substrate 31 to be connected to the interconnect board 20. The connection terminals 32 are connected to the second connection terminals 23-2 or the metal piles 24 of the interconnect board 20. The second circuit board 30 also includes a power supply line 34 for supplying an electric signal to the first circuit board 10 by using at least one of the metal piles 24 as a power supply conductive member. Additionally, the second circuit board 30 includes a ground line 35 for connecting the first circuit board 10 to ground through the first connection terminals 23-1, the first metal plate 22-1, the second metal plate 22-2, and the second connection terminals 23-2 of the interconnect board 20.

Each connection terminal of the interconnect board 20 is connected to the corresponding connection terminal of the first circuit board 10 or the second circuit board 30 by reflow soldering using a solder ball. However, the connection method is not limited to the reflow soldering and the connection may be made with an adhesive or by directly soldering the corresponding connection terminals.

As described above, in accordance with the first embodiment, the interconnect board 20 electrically connects the first circuit board 10 to the second circuit board 30. The first and second insulating layers 21-1 and 21-2 function as a stiffener. Accordingly, such a configuration allows the interconnect board 20 to suppress stress of bending and deflection of the first circuit board 10.

The insulating substrate 28 arranged between the first insulating layer 21-1 and the second insulating layer 21-2 increases capacitance of the power supply layer or the ground layer to reduce noise and stabilizes electrical properties of the power supply layer or the ground layer.

Three or more insulating layers wrapping the metal plates may be laminated through an insulting substrate therebetween. The capacitor effect generated by such a configuration further increases capacitance of the power supply layer or the ground layer and stabilizes the electrical properties of the power supply layer or the ground layer.

In a following embodiment, a description will be given for a large scale integration (LSI) serving as a semiconductor element, an interposer serving as an interconnect board, and a mother board of an electronic device serving as a circuit board, for example. However, the disclosed technology is not limited to the LSI, the interposer, and the mother board, and may be widely applied to general semiconductor elements, general interconnect boards, and general circuit boards to achieve an object thereof.

Figure 2A:
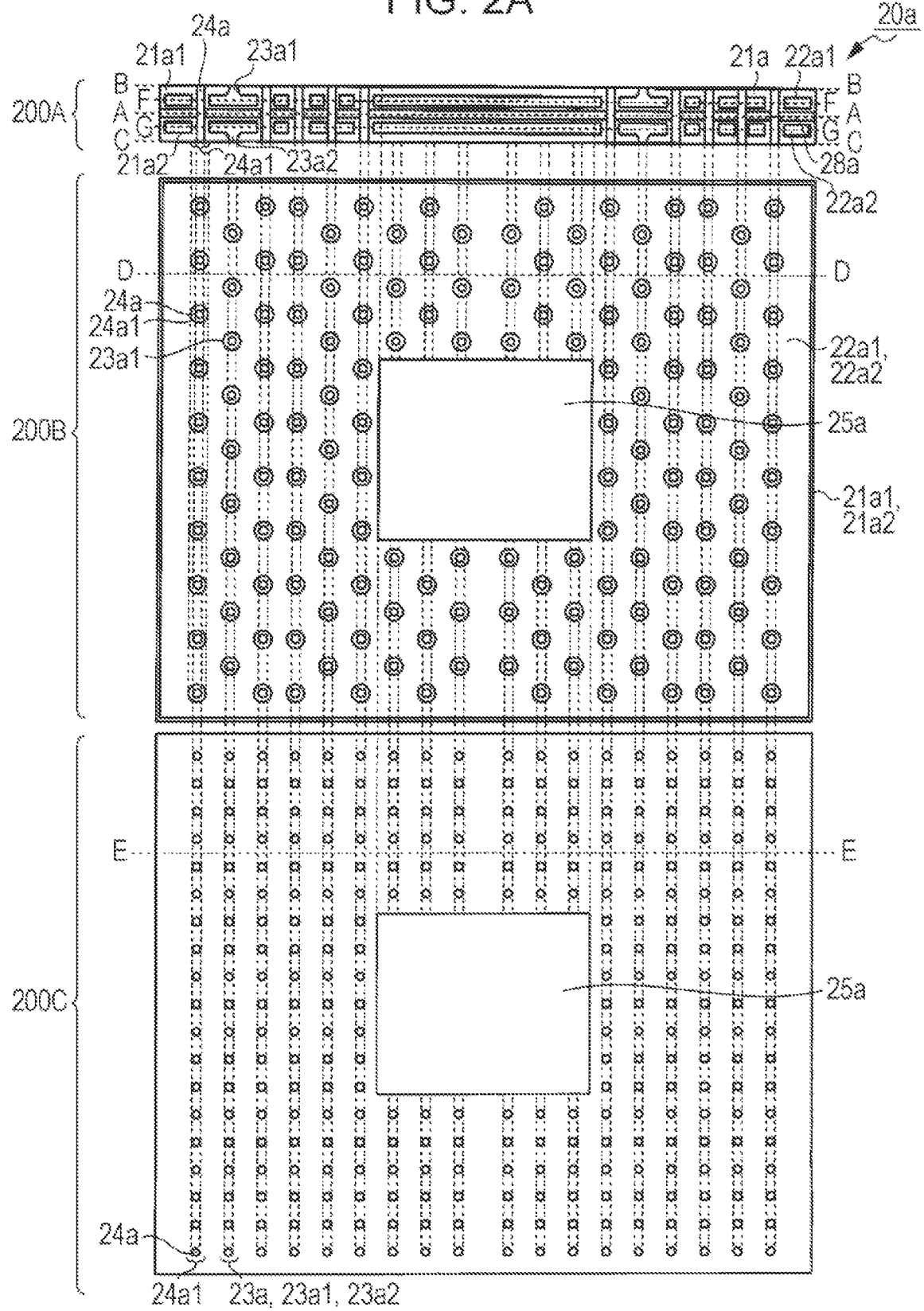
FIGS. 2A and 2B are diagrams illustrating a configuration of an interposer according to a second embodiment.
Figure 2B:
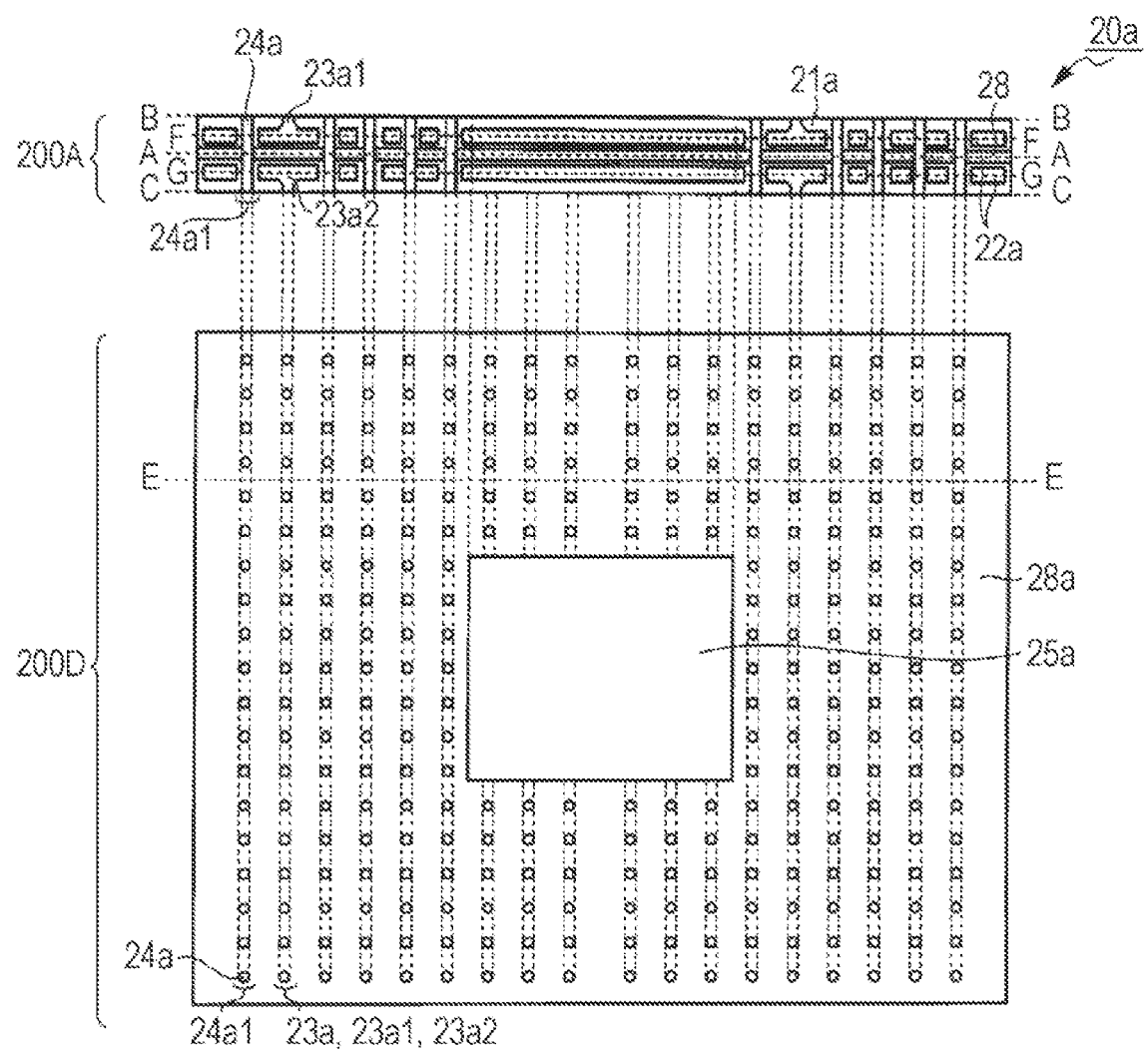

FIGS. 2A and 2B are diagrams illustrating an interposer according to a second embodiment. FIG. 2A illustrates a cross section 200A of an interposer 20a according to the second embodiment. In FIGS. 2A and 2B, a reference character is representatively attached to one of similar components and reference characters for the other similar components are omitted.

FIG. 2A also illustrates a surface 200B of the interposer 20a taken along line F-F or G-G of the cross section 200A. Additionally, FIG. 2A illustrates a surface 200C of the interposer 20a taken along line B-B or C-C of the cross section 200A. The cross section 200A corresponds to a cross section taken along line D-D of the surface 200B or a cross section taken along line E-E of the surface 200C. FIG. 2B illustrates a surface 200D of the interposer 20a taken along line A-A of the cross section 200A.

In the cross section 200A illustrated in FIG. 2A, line B-B of the interposer 20a indicates a surface for mounting an LSI package, not illustrated, whereas line C-C of the interposer 20a indicates a surface facing a mother board, not illustrated, for mounting the interposer 20a.

The interposer 20a includes first and second plate-like insulating layers 21a1 and 21a2, respectively, each made of a glass fiber reinforced epoxy resin and serving as a substrate. Accordingly, the interposer 20a has a thermal expansion coefficient smaller than a package substrate of the LSI package. When the LSI package is mounted on the interposer 20a and corresponding connection terminals thereof are fixed together, the interposer 20a functions as a stiffener for suppressing thermal expansion of the package substrate of the LSI package caused by heat generated by an LSI of the LSI package.

The interposer 20a includes a first metal plate 22a1, such as a copper foil, wrapped in the first insulating layer 21a1. The first metal plate 22a1 is formed as one structure in the surface indicated by line F-F. As illustrated in the cross section 200A of FIG. 2A, the first metal plate 22a1 includes a plurality of connection terminals penetrating the first insulating layer 21a1 and exposed on the surface for mounting the LSI package (hereinafter, referred to as an LSI-package mounting surface) indicated by line B-B.

The interposer 20a also includes a second metal plate 22a2, such as a copper foil, wrapped in the second insulating layer 21a2. The second metal plate 22a2 is formed as one structure in the surface indicated by line G-G. As illustrated in the cross section 200A of FIG. 2A, the second metal plate 22a2 includes a plurality of connection terminals penetrating the second insulating layer 21a2 and exposed on the surface facing the mother board (hereinafter, referred to as a mother-board facing surface) indicated by line C-C.

As illustrated in the surface 200D of FIG. 2B, the interposer 20a includes a thin-film insulating substrate 28a made of polyimide disposed between the first insulating layer 21a1 and the second insulating layer 21a2. The insulating substrate 28a extends over the surface indicated by line A-A between the first insulating layer 21a1 and the second insulating layer 21a2.

First connection terminals 23a1 penetrate the first insulating layer 21a1 from the first metal plate 22a1 to be exposed on the LSI-package mounting surface indicated by line B-B. Similarly, second connection terminals 23a2 penetrate the second insulating layer 21a2 from the second metal plate 22a2 to be exposed on the mother-board facing surface indicated by line C-C.

The first connection terminals 23a1 and the second connection terminals 23a2 are exposed on the LSI-package mounting surface and the mother-board facing surface to form pairs with respect to the insulating substrate 28a. As illustrated in the cross section 200A of FIG. 2A, the interposer 20a includes more than one pair of the first connection terminal 23a1 and the second connection terminal 23a2.

The first connection terminals 23a1 electrically connect, with solder balls, the first metal plate 22a1 of the interposer 20a to a power supply terminal or a ground terminal of the LSI package mounted on the interposer 20a. The second connection terminals 23a2 electrically connect, with solder balls, the second metal plate 22a2 of the interposer 20a to a power supply terminal or a ground terminal of the mother board for mounting the interposer 20a.

Accordingly, the first metal plate 22a1 and the second metal plate 22a2 of the interposer 20a function as a power supply layer for supplying electric power fed from the mother board to the LSI of the LSI package or as a ground layer for connecting the LSI to ground. Herein, the power supply layer or the ground layer is also referred to as a power supply/ground layer (V/G layer).

Since each of the first metal plate 22a1 and the second metal plate 22a2 is formed as one structure, it is possible to supply electric power to the LSI of the LSI package and connect the LSI to ground by connecting one of the second connection terminals 23a2 to the power supply terminal and the ground terminal of the mother board, respectively.

As illustrated in the cross section 200A of FIG. 2A, the interposer 20a includes a plurality of metal piles 24a made of copper that penetrate the first insulating layer 21a1, the first metal plate 22a1, the insulating substrate 28a, the second metal plate 22a2, and the second insulating layer 21a2 from the LSI-package mounting surface indicated by line B-B to the mother-board facing surface indicated by line C-C.

As described above, the first metal plate 22a1 is wholly wrapped in the first insulating layer 21a1, whereas the second metal plate 22a2 is wholly wrapped in the second insulating layer 21a2.

As illustrated in the cross section 200A and the surface 200B of FIG. 2A, the metal piles 24a are arranged in a grid. The metal piles 24a have an inside diameter smaller than through holes 24a1 provided in the first and second metal plates 22a1 and 22a2 to allow the corresponding metal piles 24a to penetrate therethrough. In this way, the first and second insulating layers 21a1 and 21a2 insulate the metal piles 24a from the first and second metal plates 22a1 and 22a2, respectively.

Accordingly, each of the metal piles 24a electrically connects a signal terminal of the LSI package to a corresponding signal terminal of the mother board independently. As illustrated in the surface 200B of FIG. 2A, ends of the first and second metal plates 22a1 and 22a2 are also wrapped in the first and second insulating layers 21a1 and 21a2, respectively.

As illustrated in the surface 200C of FIG. 2A, in the interposer 20a, the metal piles 24a and the first connection terminals 23a1 or the second connection terminals 23a2 are exposed, as connection terminals, in predetermined arrangement on the LSI-package mounting surface indicated by line B-B or the mother-board facing surface indicated by line C-C.

As illustrated in the surfaces 200B and 200C of FIG. 2A, the interposer 20a has a through hole 25a at a range of the interposer 20a where capacitors arranged on an opposite surface of the LSI package to a surface mounting the LSI physically interfere with the interposer 20a when the LSI package is mounted on the LSI-package mounting surface indicated by line B-B.

As illustrated in FIGS. 2A and 2B, the through hole 25a in a rectangular or square shape penetrates the first insulating layer 21a1, the first metal plate 22a1, the insulating substrate 28a, the second metal plate 22a2, and the second insulating layer 21a2 of the interposer 20a. When the LSI package is mounted on the interposer 20a, the through hole 25a may prevent the physical interference between the interposer 20a and the capacitors arranged on the opposite surface of the LSI package to the surface mounting the LSI from occurring.

Figure 3B:
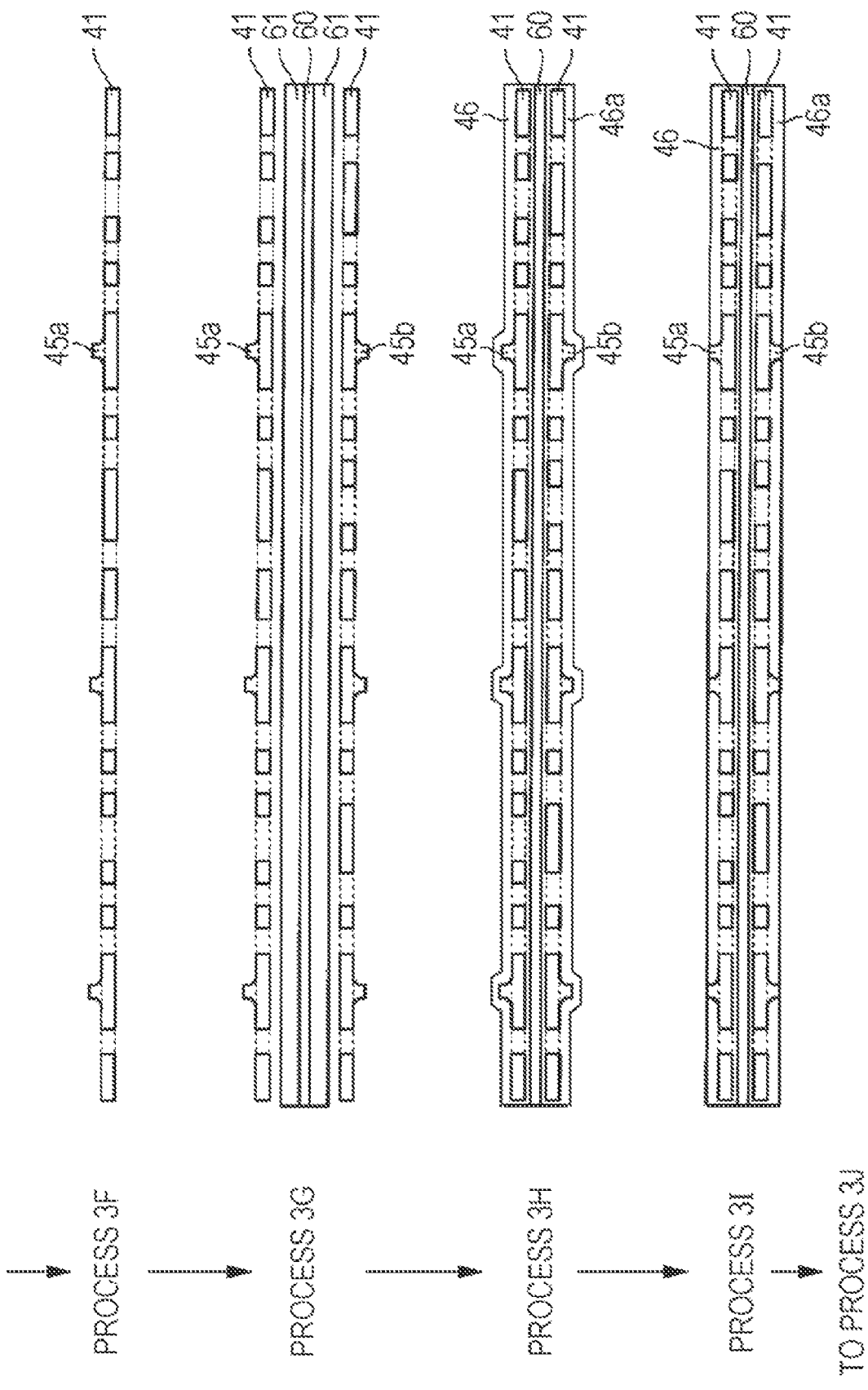

FIGS. 3A-3C are diagrams illustrating processes for fabricating the interposer according to the second embodiment. The interposer 20a is fabricated manually or by a predetermined fabrication apparatus. FIGS. 3A-3C are diagrams of a cross section of the interposer 20a in each fabrication process viewed from a lateral side thereof. In FIGS. 3A-3C, a reference character is representatively attached to one of similar components and reference characters for the other similar components are omitted.

As illustrated in PROCESS 3A of FIG. 3A, resists 42a and 42b for use in formation of through holes 43 illustrated in PROCESS 3B are applied on a front surface and a back surface of a thin plate-like copper foil 41 (e.g., approximately 1-2 mm thick), respectively. The copper foil 41 is an example of a plate-like conductive member having a low thermal expansion property. The through holes 43 are for forming metal piles (vias) 49 to be described with reference to PROCESS 3L. Each of the resists 42a and 42b is a sheet having perforated areas in a shape of the through holes 43 at positions of the through holes 43.

As illustrated in PROCESS 3B, the through holes 43 are then formed by etching at the perforated areas of the resists 42a and 42b applied on the copper foil 41. Thereafter, the resists 42a and 42b used in the formation of the through holes 43 are removed from the copper foil 41 as illustrated in PROCESS 3C.

As illustrated in PROCESS 3D, resists 44a and 44b for use in formation of terminals of a power supply layer or a ground layer are applied on the copper foil 41. The resists 44a for use in formation of the terminals of the power supply layer or ground layer are applied in a shape of the terminals at positions of the terminals.

Thereafter, as illustrated in PROCESS 3E, first connection terminals 45a of the power supply layer or the ground layer are formed by etching at the positions of the copper foil 41 having the applied resists 44a. The resists 44a used in the formation of the terminals of the power supply layer or ground layer are then removed from the copper foil 41 as illustrated in PROCESS 3F. Additionally, the resist 44b applied on the back surface of the copper foil 41 is removed from the copper foil 41.

In addition to the copper foil 41 resulting from PROCESS 3A to PROCESS 3F, another copper foil 41 having second connection terminals 45b is fabricated as illustrated in PROCESS 3G. Additionally, a polyimide substrate 60 and a pair of double-sided adhesive sheets 61 in the size of the two copper foils 41 are prepared. As described above, the polyimide substrate 60 functions as an insulating substrate, whereas the pair of double-sided adhesive sheets 61 functions as insulating layers.

Thereafter, as illustrated in PROCESS 3H, each of the two copper foils 41 is wrapped in an insulating layer 46 or 46a having a substantially uniform thickness. The two copper foils 41 wrapped in the insulting layers 46 and 46a, respectively, are adhered using the polyimide substrate 60 having the double-sided adhesive sheets 61 on respective surfaces thereof.

Joining the copper foils (metal plates) 41 wrapped in the insulating layers 46 and 46a to the respective surfaces of the polyimide substrate (insulting substrate) 60 in this way allows the interposer 20a to have a plurality of power supply layers or ground layers (i.e., two V/G layers) and to have stable electrical properties resulting from the capacitor effect described above.

Thereafter, as illustrated in PROCESS 3I, margins of the insulating layers 46 and 46a, i.e., parts corresponding to ends of the first connection terminals 45a and the second connection terminals 45b illustrated in PROCESS 3H, are ground so that the ends of the first connection terminals 45a and the second connection terminals 45b are exposed by grinding processing, respectively. As illustrated in PROCESS 3I, the exposed ends of the first connection terminals 45a and the second connection terminals 45b constitute the same planes as the insulating layers 46 and 46a, respectively.

As illustrated in PROCESS 33 of FIG. 3C, through holes 47 are then formed, by laser processing, in the through holes 43 of the copper foils 41 wrapped in the insulating layers 46 and 46a so that the through holes 47 have an inside diameter smaller than the through holes 43. Since the inside diameter of the through holes 47 is smaller than that of the through holes 43 as illustrated in PROCESS 3J, inside of the through holes 43 is covered with the insulating layers 46 and 46a.

Thereafter, as illustrated in PROCESS 3K, a resist 48 covering (surrounding) the insulating layers 46 and 46a is applied to form the metal piles 49 penetrating the insulating layers 46 and 46a and the two copper foils 41 in the through holes 47.

As illustrated in PROCESS 3L, the metal piles 49 are then formed in the through holes 47 by copper plating. Some of the metal piles 49 arranged in predetermined portions (e.g., portions 50 enclosed by dotted lines) are in contact with the copper foils 41 and the insulating layers 46 and 46a. Thereafter, as illustrated in PROCESS 3M, the resist 48 used in the formation of the metal piles 49 carried out in PROCESS 3K is then removed from the insulating layers 46 and 46a. The interposer 20a may be fabricated in accordance with the foregoing processes.

Figure 4:
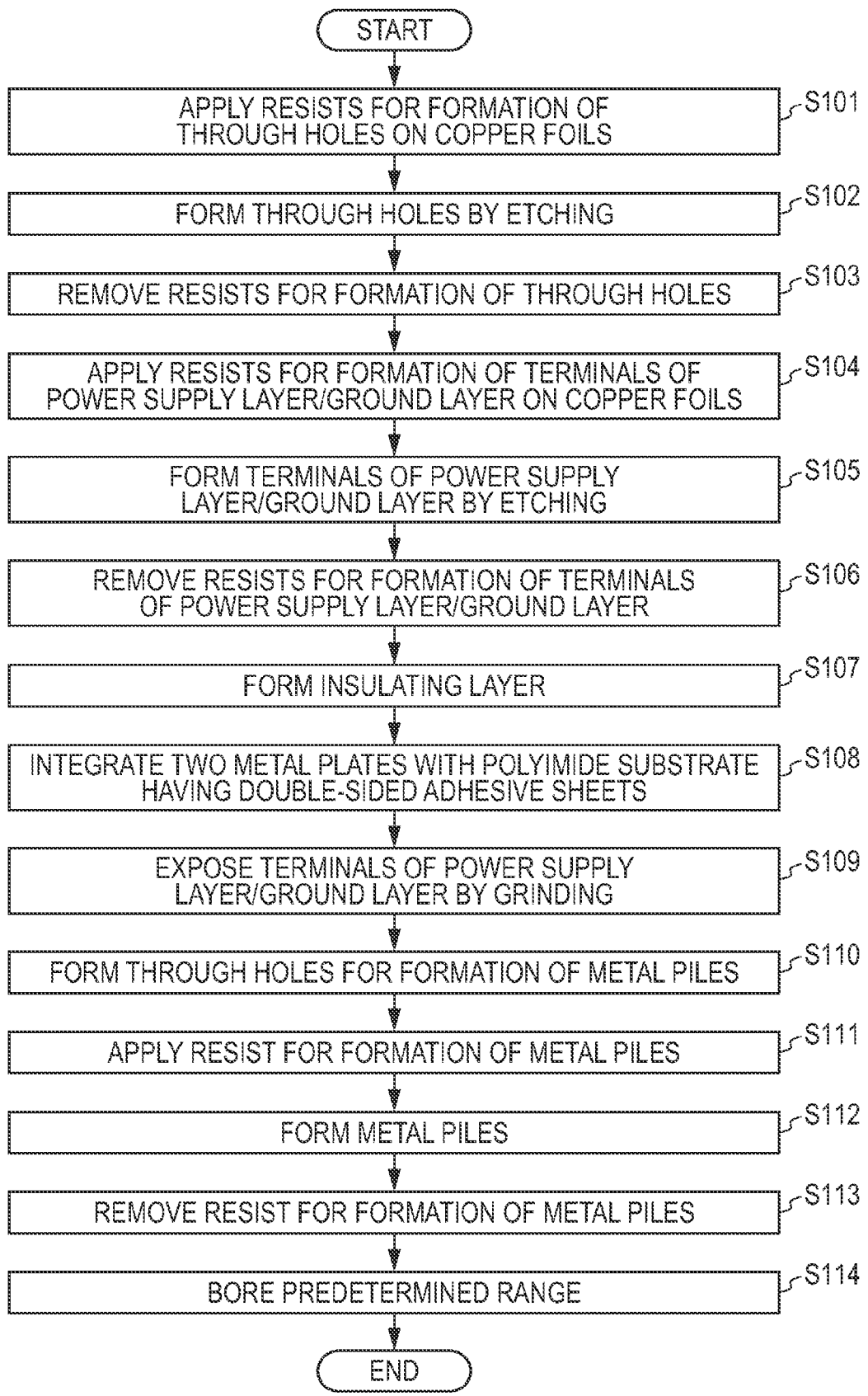
FIG. 4 is a flowchart illustrating a procedure for fabricating the interposer according to the second embodiment.

FIG. 4 is a flowchart illustrating a procedure for fabricating the interposer according to the second embodiment. The procedure for fabricating the interposer 20a is carried out manually or by a predetermined fabrication apparatus. As illustrated in FIG. 4, resists for use in formation of through holes are applied on each copper foil serving as a substrate of the interposer 20a and as a power supply layer or a ground layer (S101).

The through holes are then formed in the copper foils by etching using the resists applied on the copper foils in OPERATION S101 (S102). Thereafter, the resists used in the formation of the through holes are removed from the copper foils having the through holes formed in OPERATION S102 (S103).

Resists for use in formation of terminals of a power supply layer or a ground layer are then applied on each of the copper foils having the through holes formed in OPERATION S102 (S104). The power-supply-layer or ground-layer terminals are then formed in the copper foils by etching (S105). The resists are then removed from the copper foils having the power-supply-layer or ground-layer terminals (S106).

Thereafter, an insulating layer is formed using a glass fiber reinforced epoxy resin to wrap each of the copper foils having the power-supply-layer or ground-layer terminals (S107). The two copper foils (metal plates) wrapped in the respective insulating layers are integrated with a polyimide substrate having double-sided adhesive sheets on respective surfaces thereof (S108). Parts of the insulating layers covering the power-supply-layer or ground-layer terminals of the copper foils are ground so that parts of the power-supply-layer or ground-layer terminals are exposed from the respective insulating layers (S109).

Through holes for use in formation of metal piles are formed by laser processing at positions of the through holes of the copper foils covered with the insulating layers in OPERATION S107 to have an inside diameter smaller than the through holes of the copper foils (S110). A resist for use in formation of the metal piles is then applied to cover the insulating layers having the through holes formed in OPERATION S110 (S111).

Thereafter, the metal piles are formed by copper plating in the metal-pile formation through holes of the insulating layers to which the resist is applied in OPERATION S111 (S112). The resist used in the formation of the metal piles is removed from the insulating layers having the metal piles (S113). A range of the interposer that physically interferes with capacitors arranged on an opposite surface of an LSI package to a surface mounting an LSI when the LSI package is mounted on the insulating layer is bored to form a through hole (S114). Although the processes for fabricating the interposer have been described above, the sequential order of the processes is not limited to the described one and some of the processes may be carried out in parallel or switched.

Figure 5:
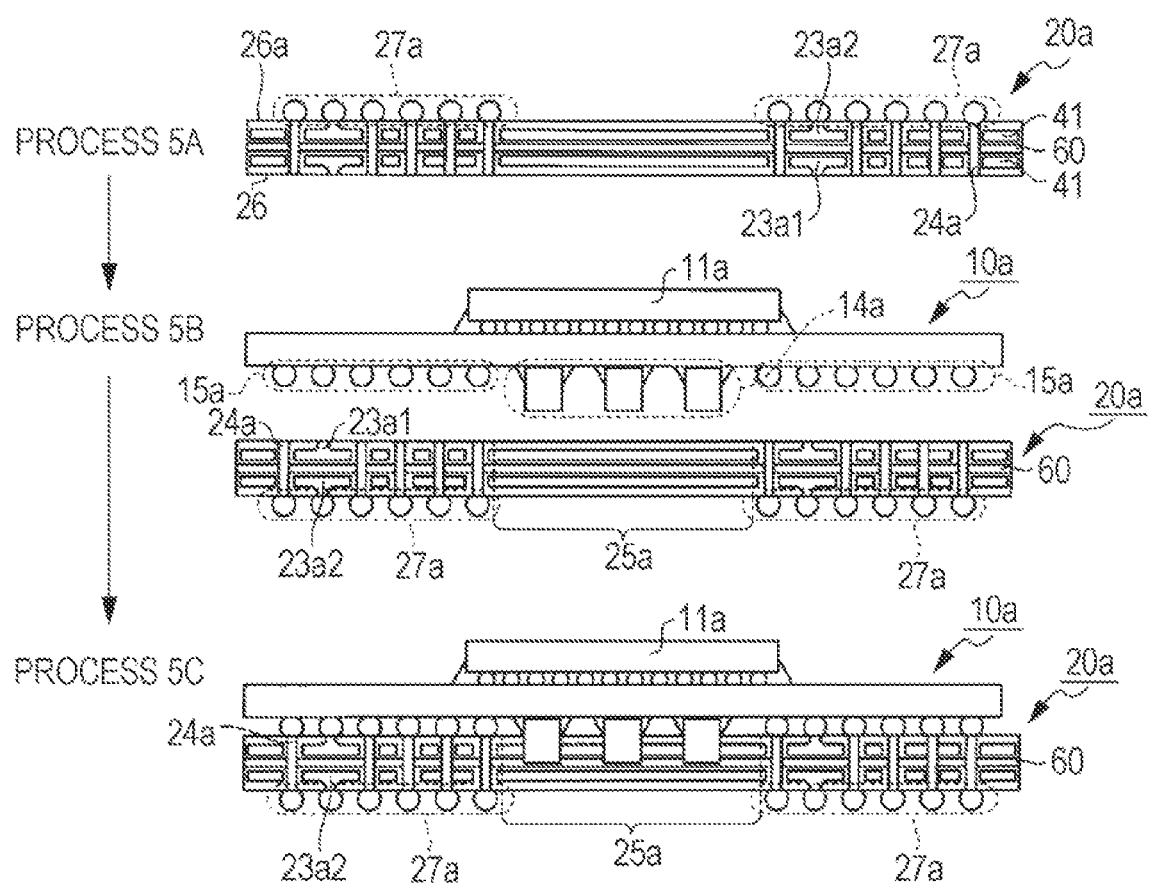
FIG. 5 is a diagram illustrating processes for mounting a large scale integration (LSI) package on the interposer according to the second embodiment.

FIG. 5 is a diagram illustrating processes for mounting a semiconductor package (i.e., an LSI package) on the interposer according to the second embodiment. As illustrated in PROCESS 5A, solder balls 27a are joined to the metal piles 24a and the second connection terminals 23a2 exposed on one surface of the interposer 20a. As described above, the interposer 20a is formed by joining the two copper foils 41, each wrapped in an insulating layer 26 or 26a, to the respective surfaces of the polyimide substrate 60 (see FIG. 3C).

As illustrated in PROCESS 5B, the interposer 20a holding the solder balls 27a joined thereto in PROCESS 5A is turned over. The LSI package 10a having connection terminals joined to solder balls 15a is then mounted on the other surface of the interposer 20a not holding the solder balls 27a.

Thereafter, as illustrated in PROCESS 5C, the connection terminals of the LSI package 10a are connected to the corresponding first connection terminals 23a1 and the exposed parts of the metal piles 24a of the interposer 20a by, for example, reflow soldering. When the LSI package 10a is mounted on the interposer 20a, capacitors 14a arranged on an opposite surface of the LSI package to a surface mounting an LSI 11a are placed in the through hole 25a.

Figure 6:
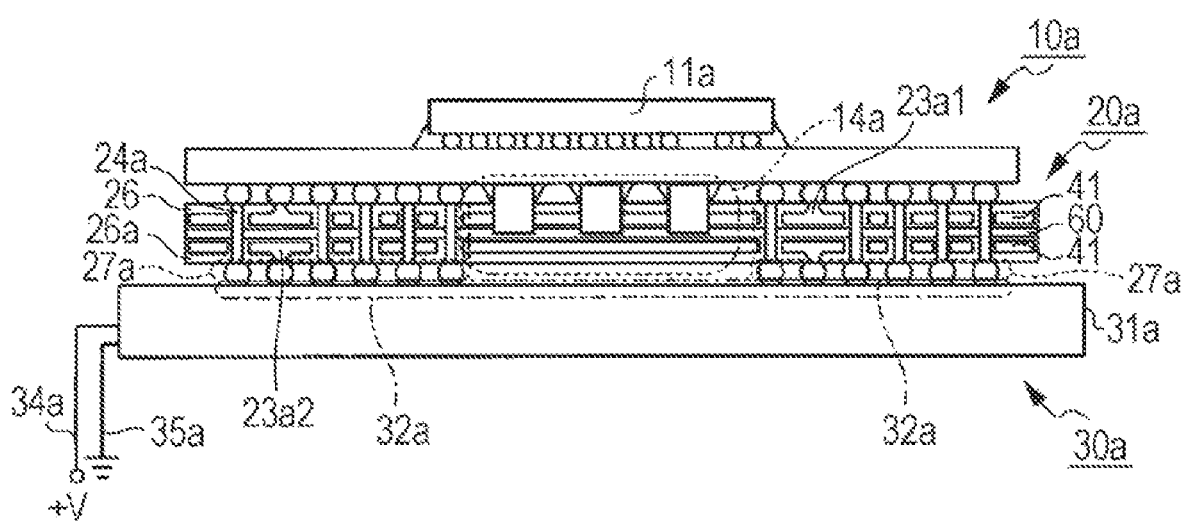
FIG. 6 is a diagram illustrating a process for mounting an LSI package on a mother board using the interposer according to the second embodiment.

FIG. 6 is a diagram illustrating a process for mounting an LSI package on a mother board using the interposer according to the second embodiment. As illustrated in FIG. 6, the second connection terminals 23a2 and the metal piles 24a of the interposer 20a are connected to connection terminals 32a disposed on a substrate 31a of a mother board 30a with the solder balls 27a.

As illustrated in FIG. 6, the mother board 30a includes a power supply line 34a for supplying an electric signal to the LSI package 10a by using at least one of the metal piles 24a as a power supply conductive member.

The mother board 30a also includes a ground line 35a. The ground line 35a allows the LSI package 10a to be connected to ground through the first connection terminals 23a1 formed in the copper foil (metal plate) 41 wrapped in the insulating layer 26 and the second connection terminals 23a2 formed in the copper foil (metal plate) 41 wrapped in the insulating layer 26a of the interposer 20a.

Figure 7:
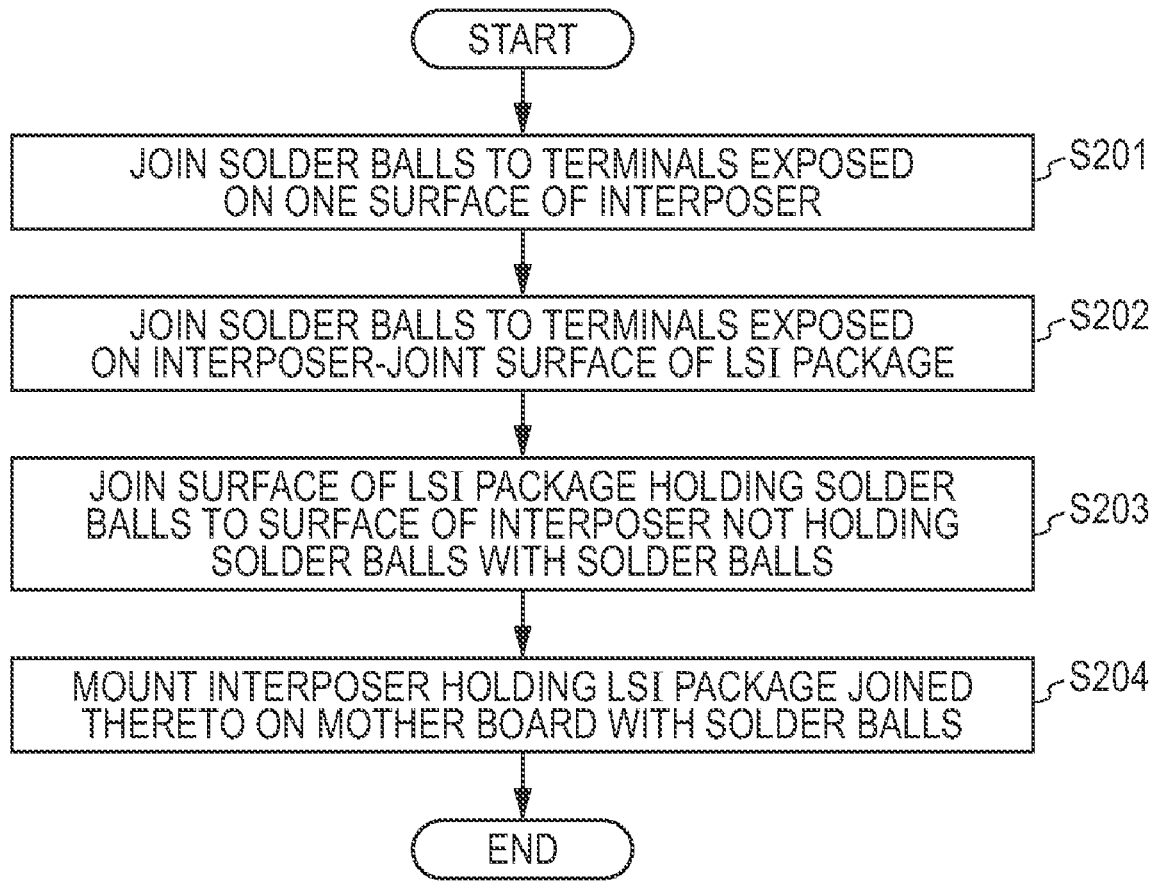
FIG. 7 is a flowchart illustrating a procedure for mounting an LSI package on a mother board using the interposer according to the second embodiment.

FIG. 7 is a flowchart illustrating a procedure for mounting an LSI package on a mother board using the interposer according to the second embodiment. The procedure for mounting the LSI package on the mother board using the interposer is carried out manually or by a predetermined mounting apparatus.

Solder balls are joined to terminals exposed on one surface of the interposer (S201). Thereafter, solder balls are joined to terminals exposed on a surface of the LSI package to be connected to the interposer (S202).

The surface of the LSI package holding the solder balls is then joined to a surface of the interposer not holding solder balls with the solder balls of the LSI package so that the LSI package is mounted on the interposer (S203). Thereafter, the interposer holding the LSI package joined thereto is mounted on the mother board with the solder balls of the interposer (S204).

As described above, in accordance with the second embodiment, the interposer 20a disposed between the LSI package 10a and the mother board 30a electrically connects the LSI package 10a to the mother board 30a and functions as a stiffener. Accordingly, in this case, the interposer 20a has functions of an electrical connector and a stiffener.

In addition, a capacitor effect is generated by the polyimide substrate 60 serving as an insulating substrate that is disposed between the insulating layers wrapping the respective copper foils 41. The capacitor effect allows the two metal plates formed of the copper foils 41 to electrically function as one structure and improves electrical properties. Accordingly, the second embodiment allows the interposer 20a including the metal plates functioning as a power supply layer or a ground layer to be fabricated in a simple fabrication method and provided inexpensively.

Figure 8:
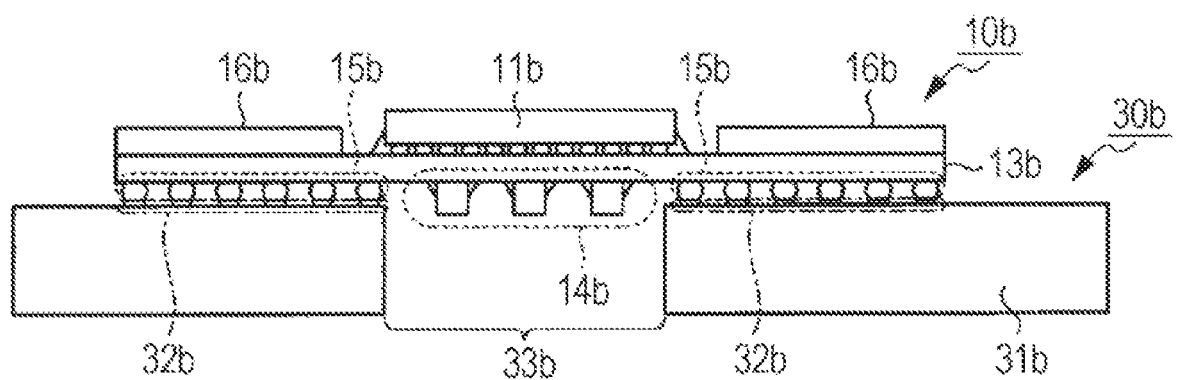
FIG. 8 is a diagram illustrating a comparative example for mounting an LSI package on a mother board.

FIG. 8 is a diagram illustrating a comparative example for mounting an LSI package on a mother board. More specifically, the second embodiment omits a stiffener 16b disposed on a package substrate 13b of an LSI package 10b illustrated in a comparative example for mounting the LSI package 10b on a mother board 30b in FIG. 8. Since the interposer 20a functions as a stiffener, the interposer 20a has a reinforcing effect higher than the comparative example.

Discussion will be given for a case for mounting the LSI package 10b directly on the mother board 30b with solder balls 15b and connection terminals 32b arranged on a substrate 31b of the mother board 30b as illustrated in FIG. 8. In such a case, physical interference between the mother board 30b and capacitors 14b arranged on a surface opposite to a surface holding an LSI 11b has to be avoided.

The use of the interposer 20a according to the second embodiment allows the interference between the capacitors 14a and the mother board 30a to be avoided without an interference-preventing hole 33b formed by countersinking or boring an interfering range of the mother board 30b. Thus, a wire for supplying electric power to the LSI 11a does not have to be arranged to detour around an interference-preventing part in the mother board 30a, which leads to stable supply of electric power to the LSI 11a.

Each connection terminal of the interposer 20a is connected to the corresponding connection terminal of the LSI package 10a or the mother board 30a by reflow soldering using a solder ball. However, the connection method is not limited to the reflow soldering and the connection may be made with an adhesive or by directly soldering the corresponding connection terminals.

One embodiment of the disclosed technology advantageously allows a semiconductor-element package to be mounted on a circuit board while improving electric performance of the semiconductor-element package and the circuit board without increasing a fabrication cost of the semiconductor-element package.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An interconnect board for interconnecting and arranged between a first circuit board and a second circuit board, the interconnect board comprising:
a first conductive plate including a first connection terminal to be electrically connected to a power supply terminal or a ground terminal of each of the first circuit board and the second circuit board;
a first insulating member wrapping the first conductive plate except for the first connection terminal;
a second conductive plate including a second connection terminal to be electrically connected to the power supply terminal or the ground terminal of each of the first circuit board and the second circuit board;
a second insulating member wrapping the second conductive plate except for the second connection terminal;
an insulating substrate arranged between the first insulating member and the second insulating member; and
a conductive member penetrating the first insulating member, the second insulating member and the insulating substrate to electrically connect a signal terminal of the first circuit board to a signal terminal of the second circuit board.

2. The interconnect board according to claim 1, wherein the interconnect board has a through hole so that an electronic component arranged on the first circuit board is placed in the through hole when the interconnect board is arranged between the first circuit board and the second circuit board.

3. A printed circuit board unit comprising:
a first circuit board;
a second circuit board; and
an interconnect board arranged between a first circuit board and a second circuit board, the interconnect board including:
a first conductive plate including a first connection terminal to be electrically connected to a power supply terminal or a ground terminal of each of the first circuit board and the second circuit board,
a first insulating member wrapping the first conductive plate except for the first connection terminal,
a second conductive plate including a second connection terminal to be electrically connected to the power supply terminal or the ground terminal of each of the first circuit board and the second circuit board,
a second insulating member wrapping the second conductive plate except for the second connection terminal,
an insulating substrate arranged between the first insulating member and the second insulating member, and
a conductive member penetrating the first insulating member, the second insulating member and the insulating substrate to electrically connect a signal terminal of the first circuit board to a signal terminal of the second circuit board.

4. The printed circuit board unit according to claim 3, wherein the interconnect board has a through hole so that an electronic component arranged on the first circuit board is placed in the through hole.

5. The printed circuit board unit according to claim 4, wherein the first circuit board is a semiconductor element package mounting a semiconductor element, and the through hole faces an electronic component arranged on an opposite surface of the semiconductor element package to a surface with the semiconductor element.

6. The printed circuit board unit according to claim 3, further comprising:
a power supply conductive member penetrating the first insulating member, the second insulating member and the insulating substrate, wherein the power supply conductive member is connected to the power supply terminal when the connection terminal is connected to the ground terminal.

7. A method for fabricating an interconnect board for interconnecting and arranged between a first circuit board and a second circuit board, the method comprising:
applying a first resist at a first predetermined portion of each of a pair of conductive plates having a low thermal expansion property to form a first through hole;
forming the first through hole in each of the conductive plates having the first resist by etching;
removing the first resist from each of the conductive plates after the formation of the first through hole;
applying a second resist at a second predetermined portion of each of the conductive plates having the first through hole to form a connection terminal to be electrically connected to a power supply terminal or a ground terminal of each of the first circuit board and the second circuit board;
forming the connection terminal on one surface of each of the conductive plates by etching;
removing the second resist from each of the conductive plates after the formation of the connection terminal;
forming an insulating member to wrap each of the conductive plates having the connection terminal;
attaching surfaces of the conductive plates each wrapped in the insulating member without the connection terminal to an insulating substrate having an adhesive applied to both surfaces thereof;
grinding a surface of the insulating member wrapping each of the integrated conductive plates to expose an end of the connection terminal from the surface of the insulating member;
forming a second through hole in the first through hole covered with the insulating member to form a via, the second through hole having an inside diameter smaller than the first through hole;
applying a third resist on the integrated conductive plates having the second through hole to form the via;
forming the via in the second through hole of the integrated conductive plates having the third resist with a conductive material;
removing the third resist from the integrated conductive plates after the formation of the via; and
forming a third through hole at a range facing an electronic component arranged on the first circuit board so that the electronic component is placed in the third through hole when the interconnect board is arranged between the first circuit board and the second circuit board.

8. The method according to claim 7, wherein the first circuit board is a semiconductor element package mounting a semiconductor element, and the third through hole is formed at a range facing an electronic component arranged on an opposite surface of the semiconductor element package to a surface with the semiconductor element.

* * * * *